United States Patent
Askins et al.

(10) Patent No.: US 6,721,696 B1
(45) Date of Patent: Apr. 13, 2004

(54) SIMULATION PROGRAM HAVING GENERIC ATTRIBUTE ACCESS SCHEMA

(75) Inventors: Timothy M. Askins, Mesa, AZ (US); Ronald A. MacCracken, San Jose, CA (US)

(73) Assignee: Centric Software, Inc., San Jose, CA (US)

( * ) Notice: Subject to any disclaimer, the term of this patent is extended or adjusted under 35 U.S.C. 154(b) by 0 days.

(21) Appl. No.: 09/513,488

(22) Filed: Feb. 25, 2000

(51) Int. Cl.⁷ ................................................. G06F 9/45
(52) U.S. Cl. ........................................ 703/22; 709/313
(58) Field of Search ........................... 703/1–2, 6–22; 709/313

(56) References Cited

U.S. PATENT DOCUMENTS

| | | | |
|---|---|---|---|
| 5,261,099 A | 11/1993 | Bigo et al. | 709/102 |
| 5,301,331 A | 4/1994 | Ueno et al. | 710/260 |
| 5,606,365 A | 2/1997 | Maurinus et al. | 348/222.1 |
| 5,701,439 A | 12/1997 | James et al. | 703/17 |
| 5,710,894 A | 1/1998 | Maulsby et al. | 345/763 |
| 5,752,034 A | 5/1998 | Srivastava et al. | 717/130 |
| 5,794,005 A | 8/1998 | Steinman | 703/17 |
| 5,819,068 A | 10/1998 | Hasse | 703/6 |
| 5,850,538 A | 12/1998 | Steinman | 703/21 |
| 5,870,588 A | 2/1999 | Rompaey et al. | 703/13 |
| 5,872,958 A | 2/1999 | Worthington et al. | 703/13 |
| 5,930,154 A * | 7/1999 | Thalhammer-Reyero | 703/11 |
| 5,946,474 A | 8/1999 | Skogby | 703/13 |
| 5,949,551 A | 9/1999 | Miller et al. | 358/408 |
| 5,999,734 A | 12/1999 | Willis et al. | 717/149 |
| 6,088,739 A | 7/2000 | Pugh et al. | 709/315 |
| 6,300,936 B1 * | 10/2001 | Braun et al. | 345/156 |
| 6,421,823 B1 | 7/2002 | Heikes | 717/135 |

OTHER PUBLICATIONS

Hartrum, T.C.; Hiller, J.B, "Conservative synchronization in object–oriented parallel battlefield discrete event simulation," Proceedings of the 11th Workshop on Parallel and Distributed Simulation, Jun. 10–13, 1997, pp.: 12–19.*

(List continued on next page.)

Primary Examiner—Samuel Broda
(74) Attorney, Agent, or Firm—Morrison & Foerster LLP (57) ABSTRACT

A computer program product is provided for use with a computer system to execute a simulation. The computer program product includes a plurality of service computer-readable program code means. The service program code means are configured to collectively determine simulated attributes of objects of an environment under simulated operation. Each service program code means is associated with at least a subset of object attributes in an object context. At least some of the service program code means include attribute accessing computer-readable program code means coupling the service program code means to the attributes in the object context for intercommunication therebetween and for operating upon the object attributes. The intercommunication is based on identifications of the attributes by the service programs that are recognizable by the object context. Mapping computer-readable program code means couple the at least some of the service programs to the object context, for mapping a user-expressed attribute name, not recognizable by the object context, to the identification of the attributes recognizable by the object context.

4 Claims, 8 Drawing Sheets

OTHER PUBLICATIONS

Comfort, J.C, "Environment partitioned distributed simulation of queuing systems," Proceedings of the Simulation Conference, Winter, Dec. 8–11, 1991 pp.: 584–592.*

Krzysztof Pawlikowski, Steady–state simulation of queueing processes: survey of problems and solutions, ACM Computing Surveys, vol. 22, Issue 2, Jun. 1990, pp.: 123–170.*

Hartrum et al, "Conservative Synchronization in Object–Oriented Parallel Battlefield Discrete Event Simulation", IEEE Proceedings of the 11$^{th}$ Workshop on Parallel and Distributed Simulation, pp. 12–19 (Jun. 1997).*

Comfort, "Environment Partitioned Distributed Simulation of Queueing Systems", IEEE Proceedings of the Simulation Conference, pp. 584–592 (Dec. 1991).*

Pawlikowski, "Steady–State Simulation of Queueing Processes: Survey of Problems and Solutions", ACM Computing Surveys, vol. 22 No. 2, pp. 123–170 (Jun. 1990).*

Kabata, Y. et al. (1999). "An Interactive Modeling Method for Dynamic Natural Objects," *IEEE*, pp. IV 212–IV 217.

Berry, O. et al., (Jun. 6–7, 1988) "Constructing object–oriented distributed simulations" *Proceedings of 3rd Israel Conference on Computer Systems and Software Engineering*, pp. 117–121.

* cited by examiner

SIMULATION PROGRAM HAVING GENERIC ATTRIBUTE ACCESS SCHEMA

TECHNICAL FIELD

The present invention relates to simulations and, in particular, to a simulation in which the various aspects of the simulation are executed asynchronously but communicate with each other in a safely synchronized manner.

BACKGROUND

Virtual prototyping solutions can greatly accelerate product development. Obviously, the more accurately a solution simulates "reality", the more confidence one can have in that solution. On the other hand, though, the most useful simulation is typically the one that not only simulates reality faithfully, but also takes the fewest resources to do so.

Whereas reality is continuous in nature, computer simulations are forced to approximate the continuity by acting upon and examining and/or evaluating the simulation model only at discrete points in time. The greater the frequency at which the simulation model is examined, the more accurate is the simulation, since continuity is more closely approached. Thus, conventionally, simulations are designed such that the evaluation rate is high enough to sufficiently approximate reality (i.e., with acceptable error and without noticeable jumps in display), but not so fast that the computer's resources are completely exhausted.

The evaluation rate required depends largely upon the rate at which the simulated events would occur in reality. For example, if modeling the fast-moving parts within an engine, the evaluation rate should be relatively high. On the other hand, modeling the slow buildup of heat within the engine could be carried out at a much slower rate. Furthermore, where visual interaction is important, evaluation.

Since different aspects of a simulation occur with varying evaluation rate requirements, it would be preferable if each aspect executed at a rate most suitable to it. Unfortunately, conventional simulations force the entire simulation to execute at a common frequency. The common frequency is generally faster than required for some aspects of the simulation and perhaps slower than ideally required for other aspects of the simulation. For example, if the calculations of engine heat buildup could only be performed at once or twice a second due to the complexity of the calculations, the calculation of engine part positions could only be performed one or twice a second as well, even though it would be a much simpler calculation. Furthermore, visualization of movement around the engine would be seriously hampered, with position updates at only the once or twice per second rate.

A typical solution to the evaluation rate problem discussed above is to perform the simulation in batch, allowing the user to inspect the results in detail once the simulation is completed. However, even once the simulation is compiled and running, it is many times desirable to be able to interact with the simulation to affect its operation while it's running. A disadvantage of this batch approach, then, is that the simulation cannot be interactive.

What is desired is a simulation environment with which a user may easily interact.

SUMMARY

A computer program product is provided for use with a computer system to execute a simulation. The computer program product includes a plurality of service computer-readable program code means. The service program code means are configured to collectively determine simulated attributes of objects of an environment under simulated operation.

Each service program code means is associated with at least a subset of object attributes in an object context. At least some of the service program code means include attribute accessing computer-readable program code means coupling the service program code means to the attributes in the object context for intercommunication therebetween and for operating upon the object attributes. The intercommunication is based on identifications of the attributes by the service programs that are recognizable by the object context.

Mapping computer-readable program code means couple the at least some of the service programs to the object context, for mapping a user-expressed attribute name, not recognizable by the object context, to the identification of the attributes recognizable by the object context.

BRIEF DESCRIPTION OF THE FIRURES

DETAILED DESCRIPTION

Figure 1:
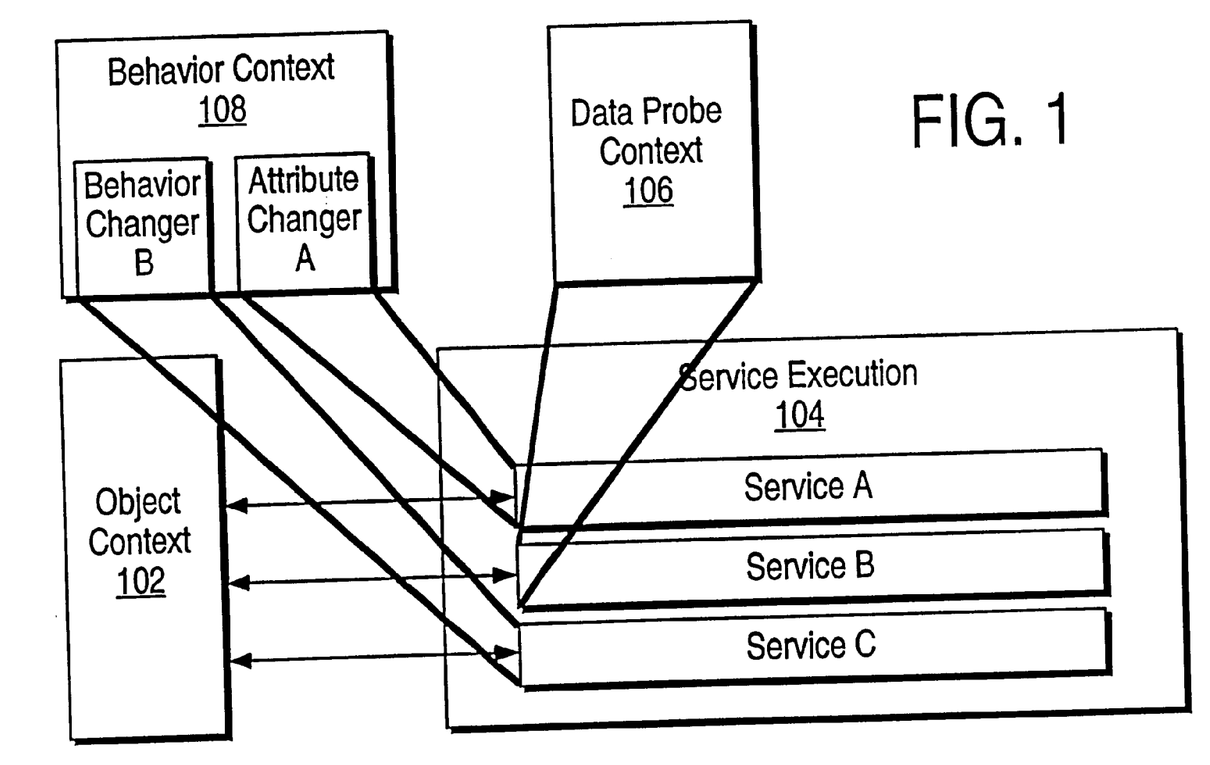
FIG. 1 broadly illustrates a simulation environment 100 in accordance with an embodiment of the invention.

A simulation environment 100 is now described, first broadly with reference to FIG. 1. Block 102 is an object database. The "attributes" of "objects" in the database 102 represent the "state" of the environment being simulated. Block 104 illustrates the execution of "services" (in this case, services A though C) that constitute the active (computational) part of the simulation.

Block 106 illustrates a "data probe context". Input and output data probes are computational objects (implemented as services in the service execution block 104) that provide the simulation user an interface to attributes of objects in the object context 102. Input data probes inject values from some source (e.g., a file or a connection to another application) into attributes of an object during a simulation. Conversely, output data probes examine the values of attributes during a simulation and provide those values to some destination such as a file or a connection to another application. Data probes are described later in greater detail.

Finally, block 108 illustrates a "behavior context". Behavior is the programming employed by a service (in the service execution block 104) that defines how a service is to affect the modeled environment during a simulation. One type of behavior is "logic", which is an event-based state machine description of behavior. Another type of behavior is "mechanism", which is a physics, kinematics-based description of behavior.

Now, the operation of the services execution block 104 is described in greater detail. As alluded to above, services are objects that perform calculations or other functionality repeatedly to accomplish the simulation. Typically, multiple services exist simultaneously and the services each perform their functionality at a particular temporal frequency. Theoretically, the number of services executing at one time is unlimited, although as a practical matter the number of services may be limited by the operating system or by computational performance limitations.

In accordance with an embodiment of the invention, the multiple services operate asynchronously, but data communication among the multiple asynchronously operating services is safely synchronized. This is accomplished even while accommodating the various asynchronous "frame rates" of the services.

To support the multiple "views" of object data required by various services. All objects to which access is required by a service are derived from a "node" base class. The node interacts with services to provide frame safe access to its data members. Each node may maintain multiple "node images" for an object (or for a portion of an object). Each service potentially sees different sets of changes at various times, although all services are ultimately working on the same values. In one embodiment, to minimize the impact on memory, the data duplication occurs at a relatively fine granularity, within objects referred to as "nodes". Nodes are typically relatively small units (portions of object), and data copies are maintained only for those nodes requiring them. Thus, memory duplication is minimized.

In one embodiment, a node does not actually contain attribute data itself. Rather, a node serves as a wrapper to one or more node images that contain the attribute data. While a node image actually contains data, a node includes "frame-safe" methodology to provide the services access the data in the node images. That is, in essence, a node hides the "multi-service issues" from the services. A service that needs to access the value of an object attribute requests the value from or writes the value to, a node corresponding to that object (or to the portion of the object that includes the attribute).

The service passes an ID of the service as an argument to the node. The node uses the ID internally to manage multiple node images it may contain. The node determines which node image is accurate for the requesting service, and creates and deletes node images as needed to maintained the required "clean" copies.

Figure 2:
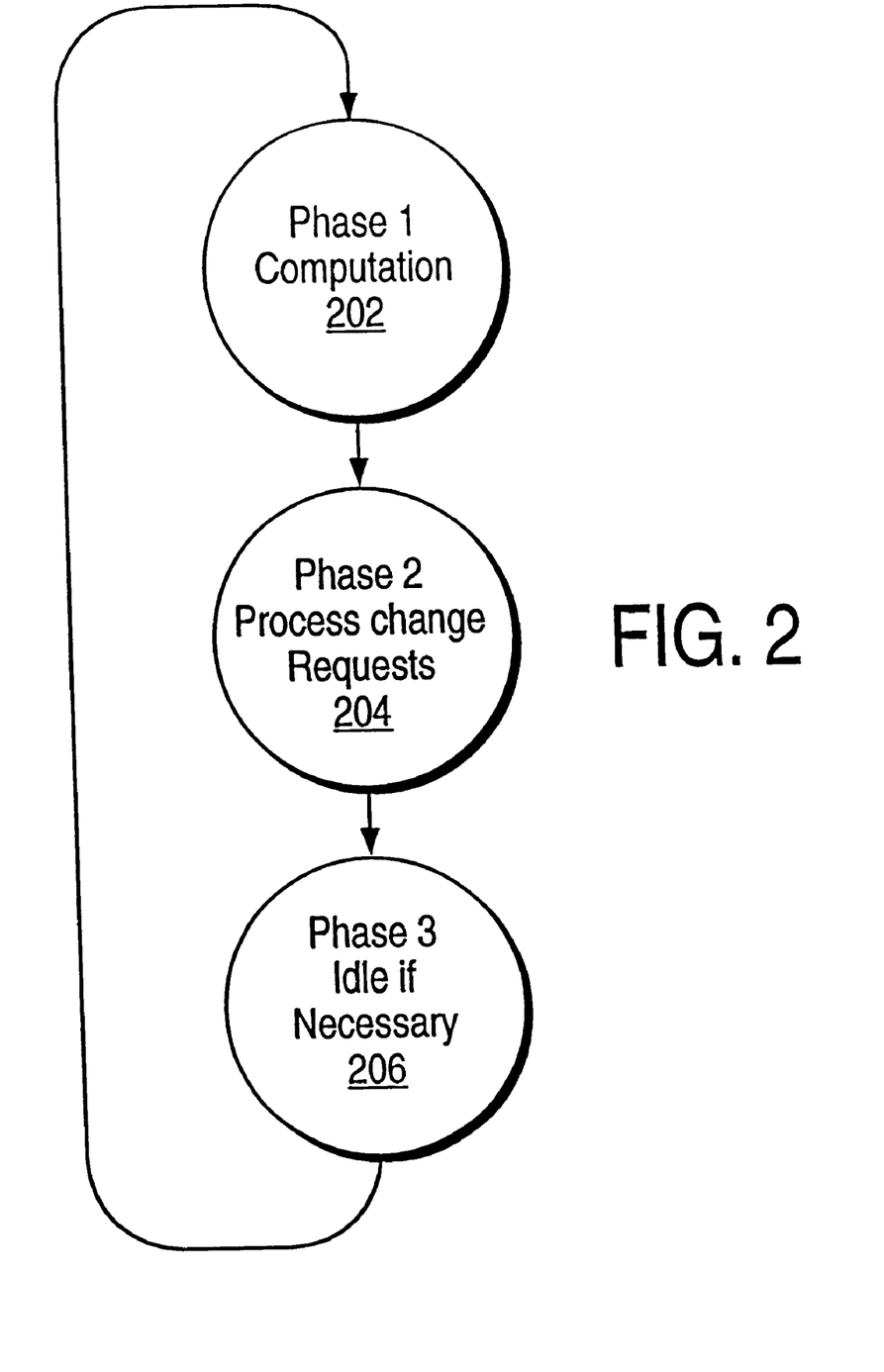
FIG. 2 illustrates processing within a service of the FIG. 1 environment 100.

Before discussing in greater detail how a service accesses node data, though, it is useful to briefly discuss the "phases" of processing that a service executes. FIG. 2 illustrates the processing phases of a typical service. First, the service performs its computations in a computational phase 202. During this computational phase 202, the service queues up (but does not yet process) "change requests". A "change request" is a request to a node to change an attribute of an object represented by the node. Also, during the computational phase 202, the service requests reading of attribute values required for its processing. The requests to read attribute values are not queued but, rather, are processed as part of the computational phase 202.

Next, the service enters a change request processing phase 204 in which it actually processes (or causes to be processed) the change requests queued up during the computational phase 202. In one embodiment, the change request processing by the service consists simply of looping through the queued change requests and passing them to the appropriate nodes for execution. Alternately, the service could notify the nodes (or some other program) that change requests are in its queue for processing.

Finally, if the time period for this frame of the service has not expired by the end of the change request processing phase 204, the service enters an idle phase 206 during which it does nothing substantive until it is time to enter the computational phase 202 again.

Figure 3:
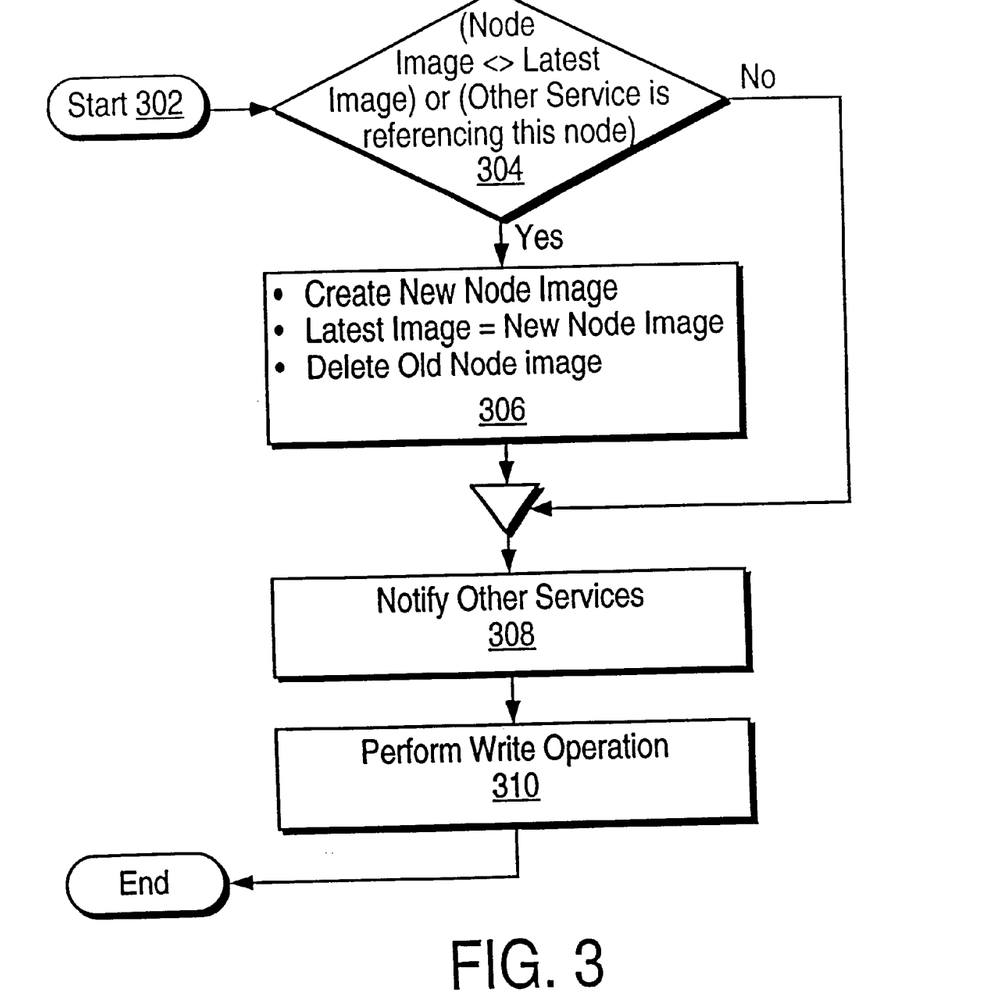
FIG. 3 illustrates how a node change request is handled by a node.

The processing of change requests is now described in greater detail. FIG. 3 illustrates the processing performed by a node in response to a change request passed from a service. After starting (302), at step 304 it is determined if the node image corresponding to the service is the "latest image" or if another service is referencing this node. What is meant by "latest image" is that this node image represents the latest updated state of the object represented by the node. (The process by which a node image becomes the "latest image" is described later.)

If either the node image is the latest image or a service other than the requesting service is referencing the node, then at step 306 a new node image is created. Also, the node records that the latest updated state of the object represented by the node (i.e., "latest image") is this new node image. The old node image is deleted.

Then (or if the determination at step 304 is "NO"), at step 308 other services for which the node is maintaining node images are notified that the "latest image" has changed. At step 310, the requested write operation is made to the node image for the service (whether the "old" node image corresponding to the service or the newly created node image corresponding to the service).

The notification (step 308), and how the notified services react to a notification, is now described. Referring back to FIG. 2, a notification is processed by a service as a "null" change request during the change request processing step 204. In particular, in response to such a notification, the notified service creates a change request for the node for which has been changed by the notifying service. The change request is "null", though, because it does not include data to be written to the object represented by the node. Rather, the change request is a request to make the node image associated with the notified service corresponds to the "latest image" if required.

Figure 4:
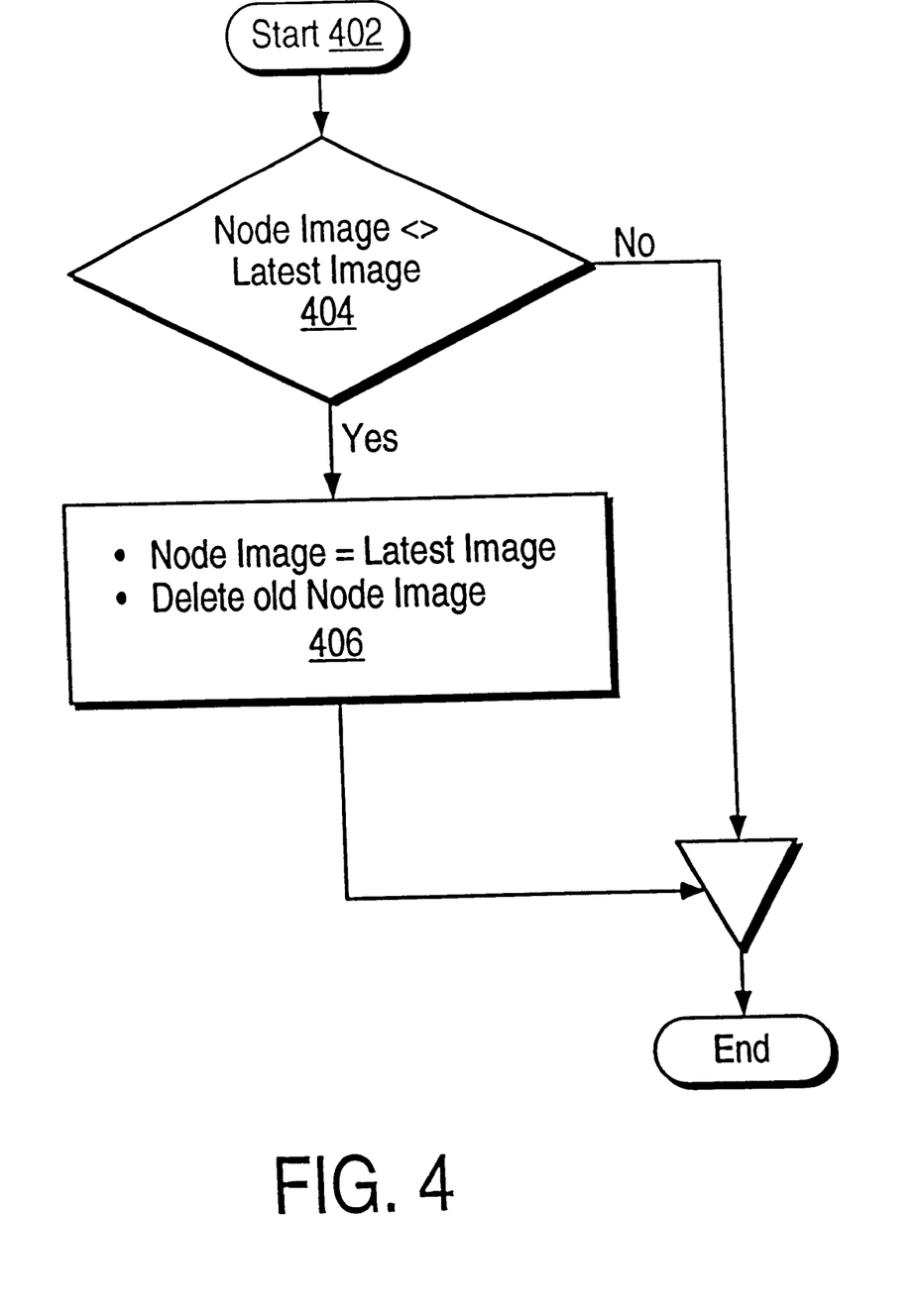
FIG. 4 illustrates how a node processes a request from a service to ensure the service is pointing to the most recently determined value for an object (or portion of an object).

FIG. 4 illustrates how a node processes a "null" change request. First, the processing starts at step 402. At step 404, a determination is made as to whether the node image presently associated with the calling service (i.e., the notified service) is the "latest" node image. If not, then there is no further processing of the "null" change request. If the node image presently associated with the calling service is not the "latest" node image, then the node associates the calling service with the "latest" node and then deletes the "old" node image for the calling service.

Figure 5:
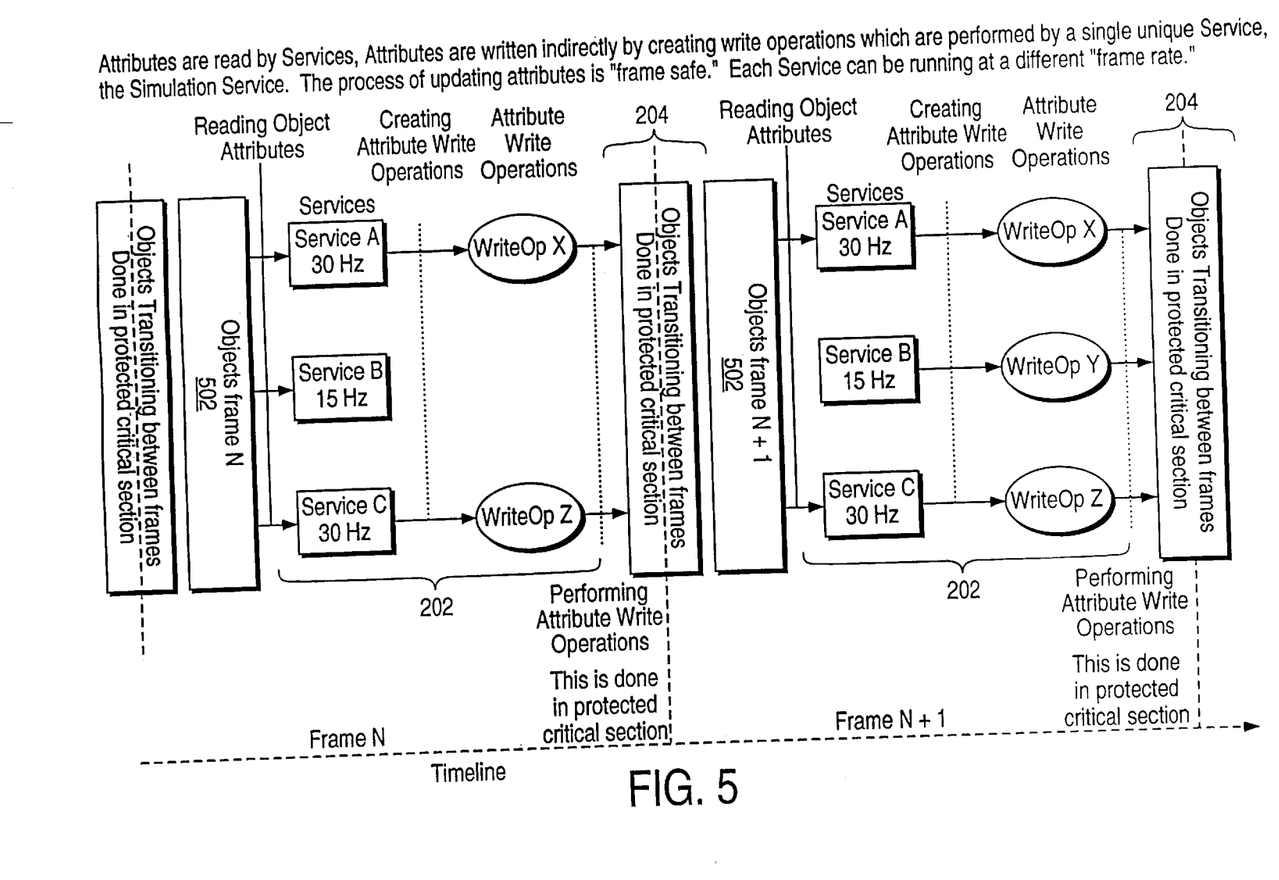
FIG. 5 is a time line that broadly illustrates how services interact.
Figure 6:
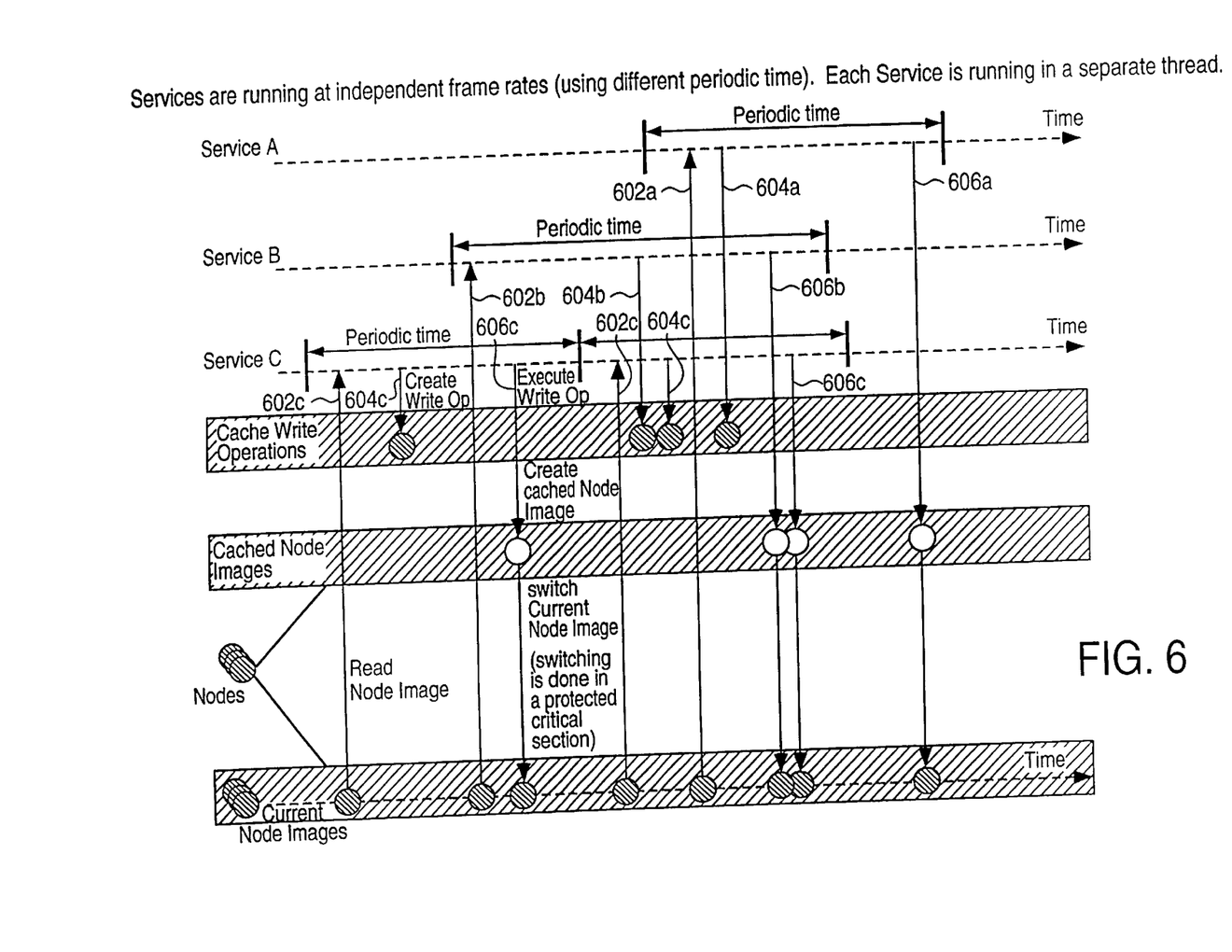
FIG. 6 is a time line that illustrates the interaction between services in greater detail.

Having described the operation of a service in isolation and also how a node reacts to change requests by a service, reference is now made to FIGS. 5 and 6 to describe how services executing in accordance with the previous discussion coexist in apparent synchronicity. FIG. 5 is a timeline that shows how each service executes in its own "frame time". In FIG. 5, the actual time a particular service spends in a frame differs from the time spent in a frame by another service, although this isn't shown in FIG. 5. That is, the services are not synchronized as would appear from FIG. 5 on its face. In fact, though, as is shown later with reference to FIG. 6, it appears to each service that it is in fact operating synchronously with the other services.

Turning now to FIG. 5, and looking at Frame N first, each service reads object attributes from an object "frame context" 502 that appears to that service to be synchronous with the frame execution of the service. (Remembering the previous discussion, this is accomplished in one embodiment by the service generating a read request to a node object, and the node object providing the requested attribute data from a "latest" node image associated with the node.) During its computational phase (202, also shown in FIG. 2), the service queues "change requests" (indicated in FIG. 5 as WriteOp's) to write object attribute data back to the object context 502. After the computational phase, each service processes its queued change requests during a protected critical section by asking the appropriate nodes to perform the changes indicated by the change requests (as shown in FIG. 3). In one embodiment, during the "critical section" for processing a change to a node, the node may not otherwise be accessed, either for read access or for write access. FIG. 5 further illustrates similar processing occurring in Frame N+1.

Now, FIG. 6 is a timeline in "real time" that illustrates how the node processing provides the appearance of synchronization to the services. Taking service A first, it can be seen (as denoted by arrow 602a) that Service A is provided a node attribute (in shorthand, "reads" the attribute, even though such "reading" is via the node object) for processing. At some point later (denoted by arrow 604a), Service A queues a write operation of an object attribute. Yet later (denoted by arrow 606a), during a protected "critical" section of processing, Service A causes (requests) the appropriate node to write the object attribute to an image (the current—or "latest"—image). This is similarly occurring for Service B and Service C, shown in FIG. 6 using the same reference numerals as for Service A but with subscripts B and C, respectively.

That is, Service B reads object attributes (602b); computes on the object attributes and queues write operations of object attributes (604b); and causes the object attributes of the queued write operations to be associated with the current image for the node (606b). A similar processing occurs for Service C (602c, 604c and 606c).

Figure 7:
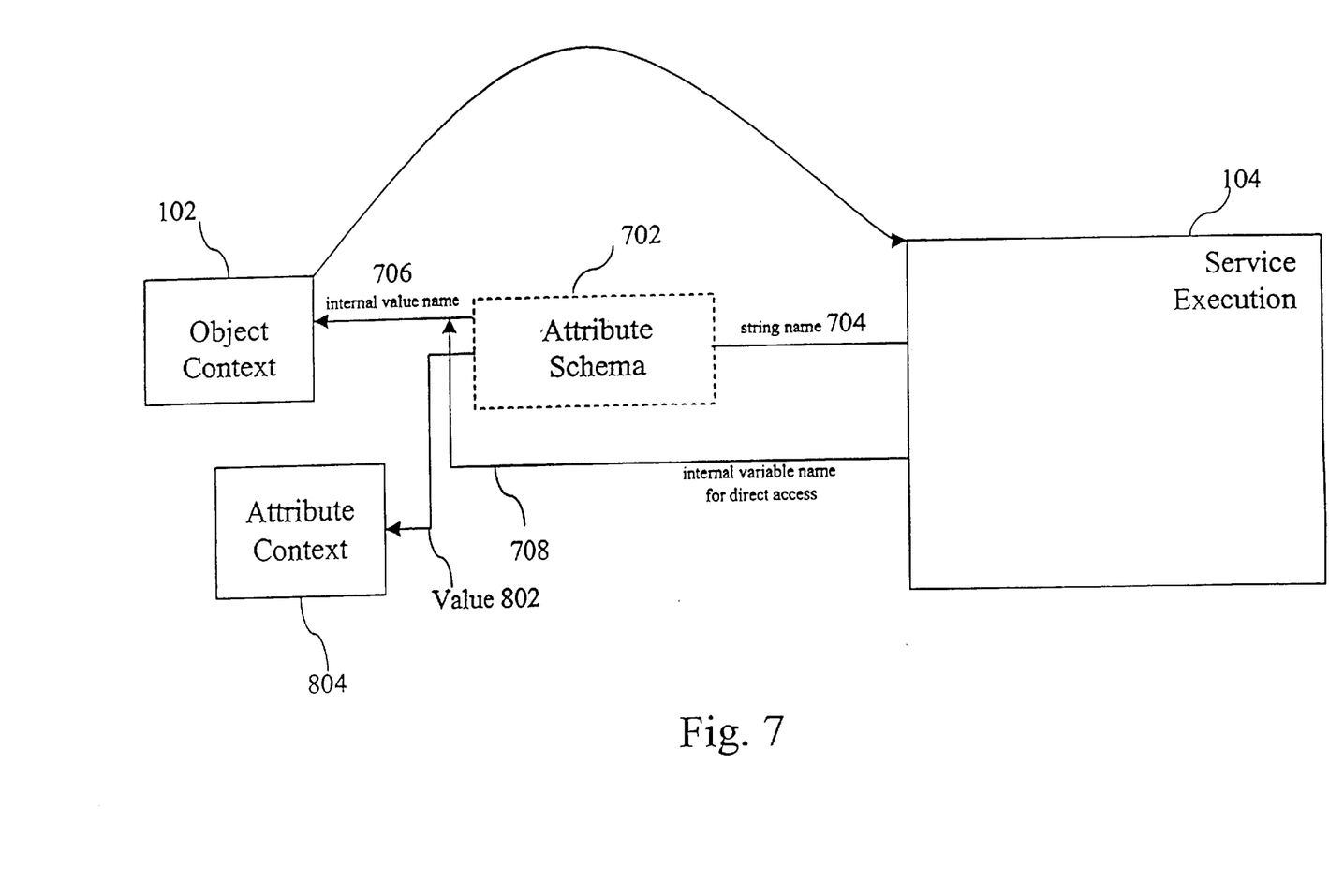
FIG. 7 illustrates how an attribute schema is employed to map string-defined names from the services to the object context, including to the attribute context.
Figure 8:
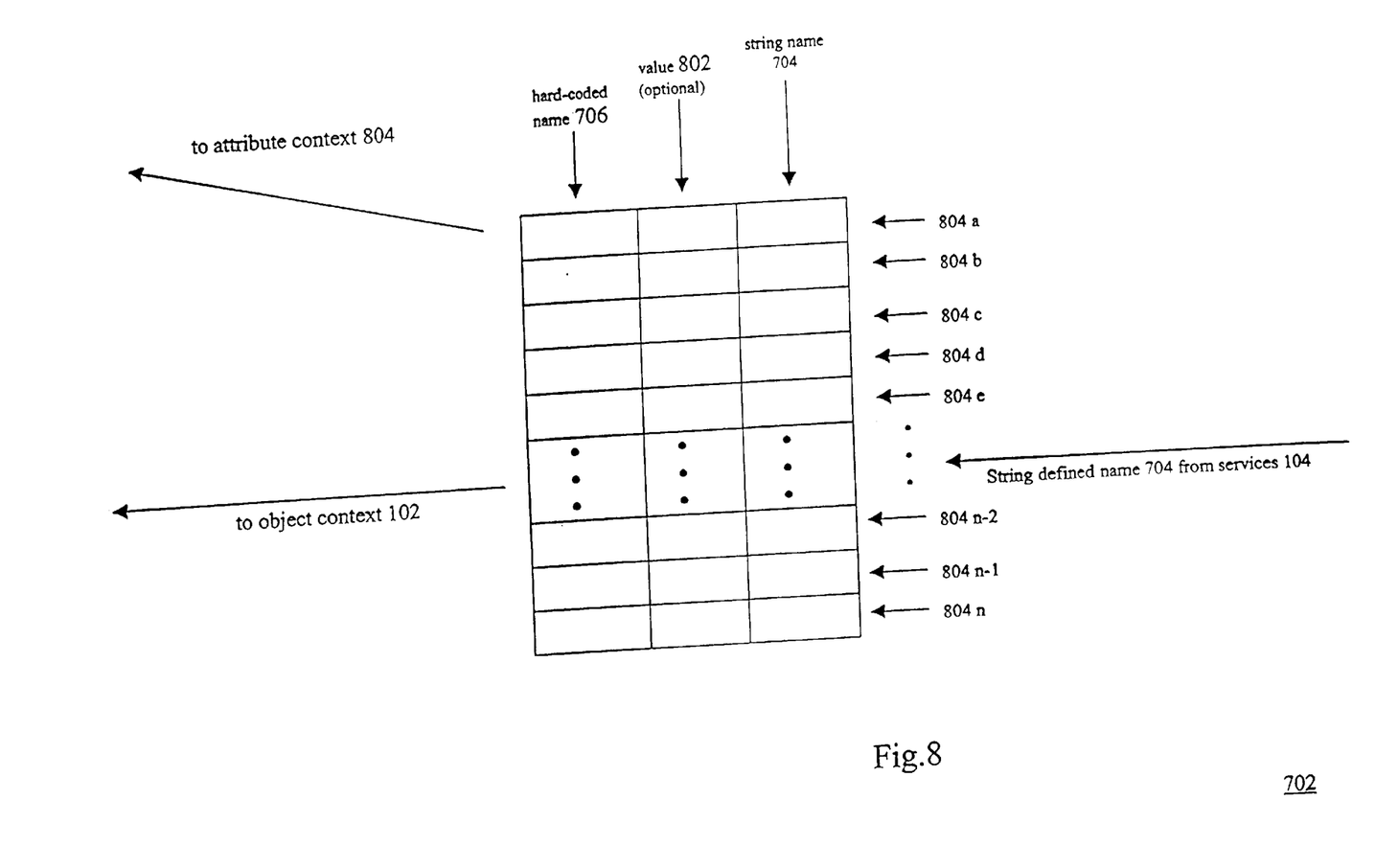
FIG. 8 illustrates the details of the attribute schema in accordance with one embodiment.

Now that an implementation of "frame safe" simulation synchronization has been discussed in some detail, a particular implementation of an attribute scheme 702 is described with reference to FIGS. 7 and 8. Broadly speaking, an attribute maps to qualities or characteristics of objects in the simulation. For example, in one aspect of an embodiment denoted by reference numeral 702 in FIGS. 7 and 8, the attribute is characterized by a string-defined name 704 provided to the attribute schema block 702. The name is mapped by the attribute schema block 702 to an internal variable name by which a quality or characteristic of an object in the simulation is represented in the object context 102.

Without the use of attributes, a variable that is a hard-coded member of an object is typically accessible to a user only through direct methods (path 708) provided by the object, often through dedicated user interface dialogs. As shown in FIG. 8, the attribute schema 702, on the other hand, provides an associative map that links the attribute name (typically a string) to the internal "hard-coded" variable of the simulation.

Attributes may also be user-added (i.e., not mapped to a "hard-coded" variable of the simulation). In this case, the attribute schema 702 holds a pointer value 802 that points to the attribute in an attribute context 804. Because user-added attributes are not hard-coded, there is typically no dedicated user interface dialog for accessing such a user-added attribute. Thus, user-added attributes are accessible only through a generic attribute access user interface (typically executing as one of the services 104). A typical use of a user-added attribute is to track resources used in a project. For example, a project may contain several hundreds of resources related to an ABS brake system design. A user can assign attributes to components to specify part name, weight, size, cost, manufacturing date and so on. Then, the user can use a query to search the project to find all components manufactured after 1995 that cost less than $40 and weigh below three pounds.

Attributes also enable a user to affect a component's behavior during simulations. That is, some built-in attributes contribute to a component's behavior—what a component is capable of being or doing. For example, one attribute may be the x-y-z position of a component in a three-dimensional scene. The user can change or affect a component's behavior by modifying the values of an attribute associated with a component (again, typically via the generic attribute access user interface), and the user can also monitor the value of that attribute during a simulation.

The base class for all "nodes" (i.e., for all exposed objects in the system) provides generic methods for accessing the attributes, using strings as names of the variables. In operation, an attribute object dynamically maps the string-defined name of the attribute to the location at which the corresponding value is actually stored. This is regardless of whether the attribute corresponds to a "hard-coded" variable or is user-added. This is in contrast to the way a code developer provides access to a member variable of an object—by specifying the name of the member variable within the source code. That is, the operation of the attribute object provides a level of abstraction to match the string-defined name of the attribute to the storage location for the value in the object contents.

Typically, the user would modify the values of the attribute using an attribute changer, such as Attribute Changer A or Attribute Changer B shown in FIG. 1. When used with an output data probe, the attribute information can be presented to the user—e.g. it can be captured and output to a text file. For example, a user might want to monitor the amount of heat generated on the brake pads of a new braking system when applied at 70 MPH.

Furthermore, in one embodiment, an expression parser is provided as part of the user interface to convert a string containing a mathematical formula, including attributes, into an expression to be analyzed, where the mathematical formula refers directly or indirectly to various variables. For example, the conversion may be into a tree of mathematical function objects. Because the formulas may use attributes as variables, the user can more easily phrase meaningful relationships of attributes dynamically. Even attributes added by the user dynamically can be accessed via such a mathematical expression, and both built-in attributes and user-defined attributes can be mixed within an expression. Typically, both the "target" of an expression (i.e., the variable to which the result of evaluating the expression is to be assigned) as well as the "sources" of the expression (i.e., the variables referenced in the expression itself) are specified by string-defined names of attributes.

The attribute schema 702 just described enhances the usability of data probes, and also of behaviors. For example, the use of complicated formulas can be avoided by using shorthand references to the attributes. To evaluate such a formula, reference is made to the attributes in the attribute table, as discussed above, to associate the shorthand references with the actual fully-named attributes of interest. It should again be noted that this association takes place dynamically at run time. As an example, instead of writing a formula such as $$\text{Engine}|\text{Piston}|X\text{position} * \text{Engine}|\text{Piston}|X\text{position} + \text{Engine}|\text{Piston}|Y\text{position} * \text{Engine}|\text{Piston}|Y\text{position}$$

the user could simply use $$v1*v1+v2*v2$$

with v1 and v2 appropriately mapped in the attribute association table to the attributes Engine|Piston|Xposition and Engine|Piston|Yposition, respectively.

Attributes are accessed only by the services and, as such, the accesses are guaranteed to be "frame safe".

It should be noted that the invention is to be defined by the claims, and not by the embodiment(s) just described.

What is claimed is:

1. A computer program product for use with a computer system to execute a simulation, comprising:
    a plurality of service computer-readable program code means, the service program code means configured to collectively determine simulated attributes of objects of an environment under simulated operation, each service program code means associated with at least a subset of object attributes in an object context, and
    attribute accessing computer-readable program code means coupling the service program code means to the attributes in the object context for intercommunication therebetween based on user-expressed identifications of the attributes by the service programs that are not recognizable by the object context
    wherein the attribute accessing computer-readable program code means includes mapping computer-readable program code means for mapping a user-expressed attribute identification, provided from the service program and not recognizable by the object context, to an identification of the attributes recognizable by the object context so that the attributes may be accessed; and
    expression parsing computer-readable program code means, for converting a string representation of a mathematical expression including user-identified attribute names to a representation of the mathematical expression including corresponding identifications of the attributes that are recognizable by the object context.

2. The program product of claim 1,
    wherein the representation into which the expression parsing program means converts includes a tree structure of constituent mathematical functions.

3. A computer program product for use with a computer system to execute a simulation, comprising:
    a plurality of service computer-readable program code means, the service program code means configured to collectively determine simulated attributes of objects of an environment under simulated operation, each service program code means associated with at least a subset of object attributes in an object context, and
    attribute accessing computer-readable program code means coupling the service program code means to the attributes in the object context for intercommunication therebetween based on user-expressed identifications of the attributes by the service programs that are not recognizable by the object context
    wherein the attribute accessing computer-readable program code means includes mapping computer-readable program code means for mapping a user-expressed attribute identification, provided from the service program and not recognizable by the object context, to an identification of the attributes recognizable by the object context so that the attributes may be accessed; and wherein:
        each service program code means is executing at a rate independent of the other service code means; and
        the program product further comprises computer-readable program code means for coordinating the intercommunication between the service programs and the object context in a manner such that each service program has a coherent view of all the object attributes in the object context.

4. The program product of claim 3, and further comprising:
    computer-readable program code means for creating an attribute, the attribute creating program code means including program means for creating a map from a user-identified attribute identification to an attribute context that is part of the object context and further including computer-readable program code means for populating the attribute context with a value for the attribute; and
    computer-readable program code
    wherein the mapping program means is further for coupling the at least some of the service programs to the attribute context, for mapping the user-identified attribute identification to the corresponding value for the attribute in the attribute context.

* * * * *